United States Patent
Jong et al.

(10) Patent No.: US 6,831,851 B2
(45) Date of Patent: Dec. 14, 2004

(54) MASK ROM

(75) Inventors: Fuh-Cheng Jong, Tainan (TW); Kent Kuohua Chang, Taipei (TW)

(73) Assignee: Macronix International Co., Ltd., Hsin-Chu (TW)

(*) Notice: Subject to any disclaimer, the term of this patent is extended or adjusted under 35 U.S.C. 154(b) by 0 days.

(21) Appl. No.: 10/386,554

(22) Filed: Mar. 13, 2003

(65) Prior Publication Data

US 2003/0198074 A1 Oct. 23, 2003

(30) Foreign Application Priority Data

Apr. 18, 2002 (TW) .......................................... 9110979 A

(51) Int. Cl.[7] .............................................. G11C 17/00
(52) U.S. Cl. ........................ 365/104; 365/96; 257/390; 257/401
(58) Field of Search .............................. 365/63, 67, 96, 365/104; 257/390, 392, 401

(56) References Cited

U.S. PATENT DOCUMENTS 5,250,831 A * 10/1993 Ishii ........................... 257/354
5,332,923 A * 7/1994 Takeuchi ..................... 257/758
5,864,496 A * 1/1999 Mueller et al. ............... 365/69
2003/0202397 A1 * 10/2003 Saito et al. .................. 365/200

* cited by examiner

*Primary Examiner*—Son Mai
(74) *Attorney, Agent, or Firm*—Birch, Stewart, Kolasch & Birch, LLP

(57) ABSTRACT

The mask ROM of the present is comprises by a plurality of word lines arranged in a grid, a plurality of memory units arranged between the word lines, each memory unit having a drain corresponding, a plurality of first bit lines arranged in parallel and extending in a direction diagonal to the word lines and above the drains, a plurality of second bit lines arranged in parallel and extending in a direction diagonal to the word lines and above the drains, a plurality of first nodes alternately arranged on the first bit lines, a plurality of second nodes alternately arranged on the second bit lines and the second nodes and the first nodes are arranged alternately; a plurality of third bit lines joined to the first bit lines, and a plurality of fourth bit lines joined to the second bit lines.

7 Claims, 5 Drawing Sheets

MASK ROM

BACKGROUND OF THE INVENTION

1. Field of the Invention

The present invention relates to a mask-type programmable read-only memory (ROM), and more particularly relates to a high density mask-type programmable read-only memory having word lines that are arranged in a grid manner, while the bit lines are parallel with the diagonal line of the memory units array, and the bit lines join the drains obliquely.

2. Description of the Related Art

Read-only memory (ROM) devices are semiconductor integrated circuits widely used in microprocessor based systems to permanently store information even when the power is off. ROM devices are particularly well suited for applications where a large volume of devices having identical data are required or for storing data that is repeatedly used. Therefore, the mask of the mask ROM is changed only when the product is different, and the manufacturing process of the Mask ROM is not modified in greater part.

Conventional mask ROM includes NOR-type and NAND-type. NOR-type ROM is formed by connecting in parallel the sources and the drains of the memory transistors. Alternatively, connecting the sources and the drains of the memory transistors in series forms a NAND-type ROM.

A 4×4 memory unit array is shown in FIG. 1, wherein the Mask ROM includes a row decoder 101, a column decoder 102, and a memory unit array 103. The row decoder 101 receives a row address value 104; and the column decoder 102 receives a column address value and output a value 106.

The memory array 103 comprises sixteen transistors 111 to 144, four bit lines, and four word lines. The four bit lines are C1, C2, C3, and C4, which connects to the column decoder 102. The four word lines are R1, R2, R3, and R4, which connect to the row decoder 101.

The bit lines are connected to the transistors by a filled inter layer as shown in FIG. 1, wherein a black point represent a connective node. A transistor is not connected without a black point.

A volt direct current is also connected to the transistor (not shown), and the volt direct current is a low voltage which represents a logic value "0".

The operation of the transistor is described as follow.

In the initial stage, the voltages of the word lines are lower than the threshold voltage, so that all of the transistors are OFF in the memory. The voltage is high of the bit lines which represent a logic value "1".

At first, the row decoder 101 receives a row address value 104, and the row address value 104 is decoded. According to the decoded result, one of the word lines R1, R2, R3, and R4 is selected to raise the voltage value, and the transistors which connects with the selected bit line are ON.

When the word line R1 is the selected one, the transistors 111, 112, 113, and 114 are ON. The bit lines C1, C3, and C4 are connected with the transistors 111, 113, and 114, so that the logic value of the C1, C2, C3, C4 output is 0, 1, 0, 0.

When the word line R2 is the selected one, the transistors 121, 122, 123, and 124 are ON. The bit lines C1 and C3 are connected with the transistors 121 and 123 so that the logic value of the C1, C2, C3, C4 output is 0, 1, 0, 1.

When the word line R3 is the selected one, the transistors 131, 132, 133, and 134 are ON. The bit lines C2 and C4 are connected with the transistors 132 and 134, so that the logic value of the C1, C2, C3, C4 output is 1, 0, 1, 0.

When the word line R4 is the selected one, the transistors 141, 142, 143, and 144 are ON. The bit lines C1, C2, C3, and C4 are connected with the transistors 141, 142, 143, and 144, so that the logic value of the C1, C2, C3, C4 output is 0, 0, 0, 0.

Next, the column decoder 102 receives a column address value 105 so as to select one of the bit lines to output an output value 106.

There are 16 logic values in all of the groups (0, 1, 0, 0), (0, 1, 0, 1), (1, 0, 1, 0) and (0, 0, 0, 0). The column decoder 102 selects one of the groups (0, 1, 0, 0), (0, 1, 0, 1), (1, 0, 1, 0) and (0, 0, 0, 0) to output an output value 106 according to the row address value 104.

In FIG. 2, there is a plurality of memory units, and each memory unit comprises a source 201, a drain 202, a plurality of word lines 203 and plurality of bit lines 204. The word lines 203 are parallel to each other and the bit lines 204 are parallel to each other and the bit lines 204 and thw word line 203 are perpendicular to each other. The sources 201 and the drains 202 are alternatively arranged in a line manner respectively, and the sources 201 and the drains 202 are arranged on the grids comprising the word lines 203 and the bit lines 204.

The word lines 203 which control a specific memory unit are conducted first, and then the bit lines 204 connected to the specific memory are coupled, and the memory unit is read.

Each drain and adjacent two sources consist of two memory units or each source and adjacent two drains consist of two memory units of the conventional Mask ROM.

SUMMARY OF THE INVENTION

Accordingly, the object of the present invention is to provide a Mask ROM, in which the arrangement of the memory array has increased memory units densely in the Mask ROM.

The present invention provides a mask ROM comprising a plurality of word lines, a plurality of memory units, a plurality of first bit lines, a plurality of second bit lines, a plurality of first nodes, a plurality of second nodes, a plurality of third bit lines, and a plurality of fourth bit lines.

The memory units are arranged between the word lines and each memory unit is provided with a corresponding drain. The first bit lines are arranged in parallel and extending in a direction diagonal to the word lines and above the drains. The second bit lines are arranged in parallel and extending in a direction diagonal to the word lines, and above the drains. The first nodes are alternately arranged on the first bit lines. The second nodes are alternately arranged on the second bit lines, and the second nodes and the first nodes are alternated. The third bit lines are joined to the first bit lines and the fourth bit lines are joined to the second bit lines.

The present invention also provides a mask ROM comprising a memory unit array, a plurality of first bit lines, a plurality of second bit lines, a plurality of third bit lines, and a plurality of a fourth bit lines.

The memory unit array comprises a plurality of word lines and a plurality of memory units, wherein the word lines are arranged in a grid manner, and each memory unit is provided with a corresponding drain. The first bit lines are arranged in parallel and extending in a direction diagonal to the word lines and above the drains, wherein the drains are coupling or noncoupling with the bit lines which correspond to the drain on both sides of each word line. The second bit lines are arranged in parallel and extending in a direction diagonal to the word lines and above the drains, wherein the drains are coupling or noncoupling with the bit lines which correspond to drain on the both sides of each word line. The third bit lines are joined to the first bit lines and the fourth bit lines are joined to the second bit lines.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by way of illustration only, and are thus not limitative of the present invention, and wherein.

DETAILED DESCRIPTION OF THE PREFERRED EMBODIMENT

Figure 1:
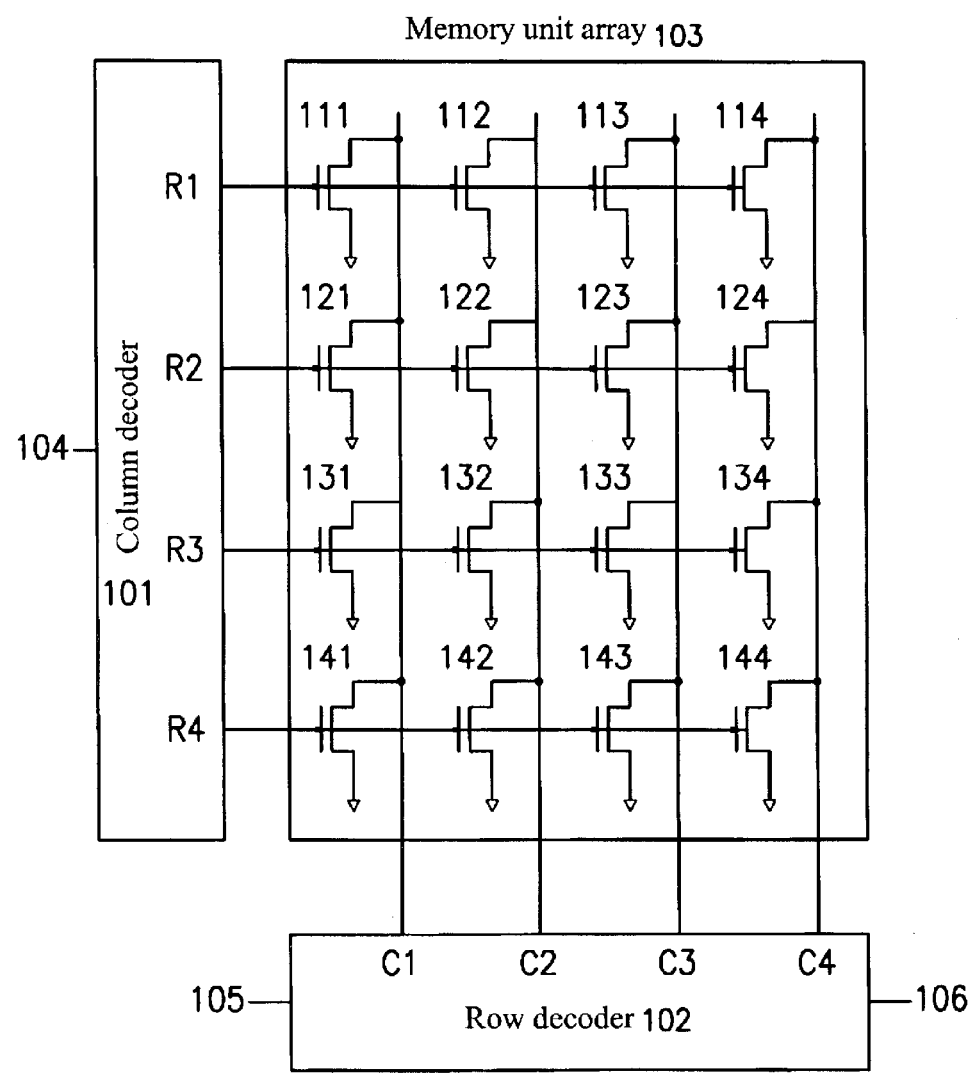
FIG. 1 depicts a block diagram of a conventional parallel Mask ROM.
Figure 2:
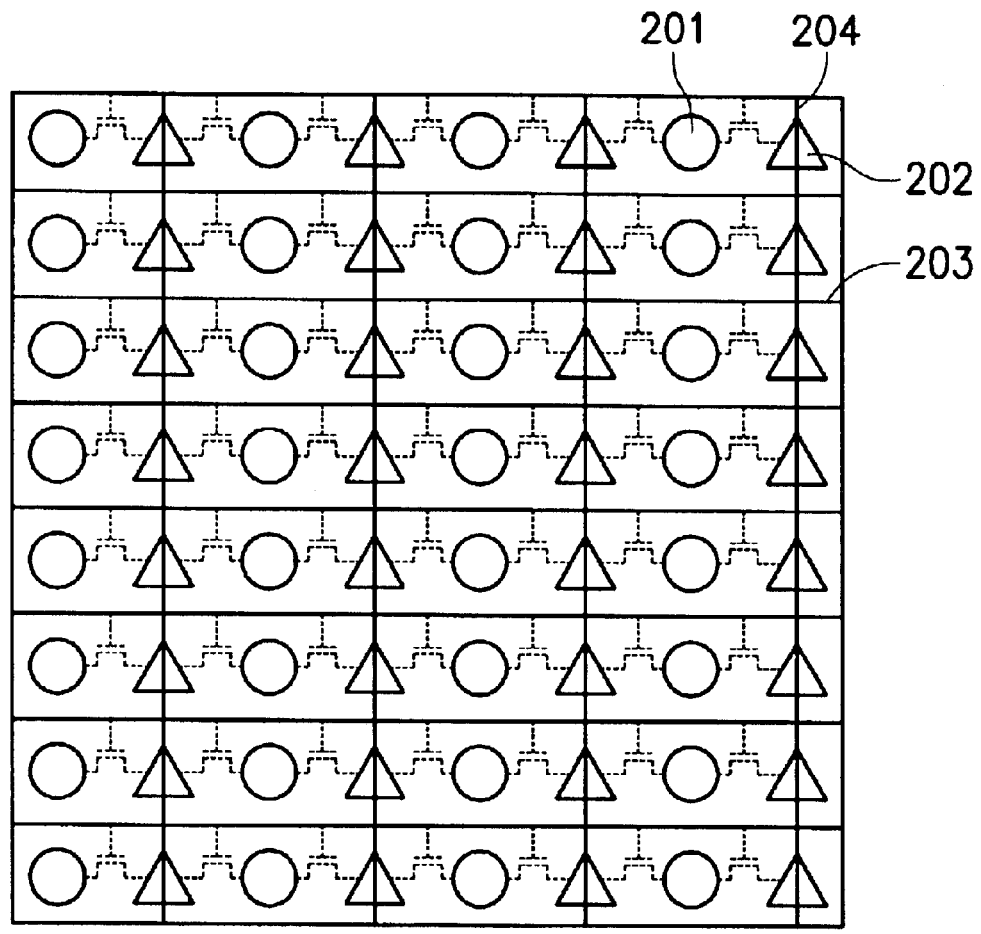
FIG. 2 depicts a conventional 8×8 memory unit array.
Figure 3A:
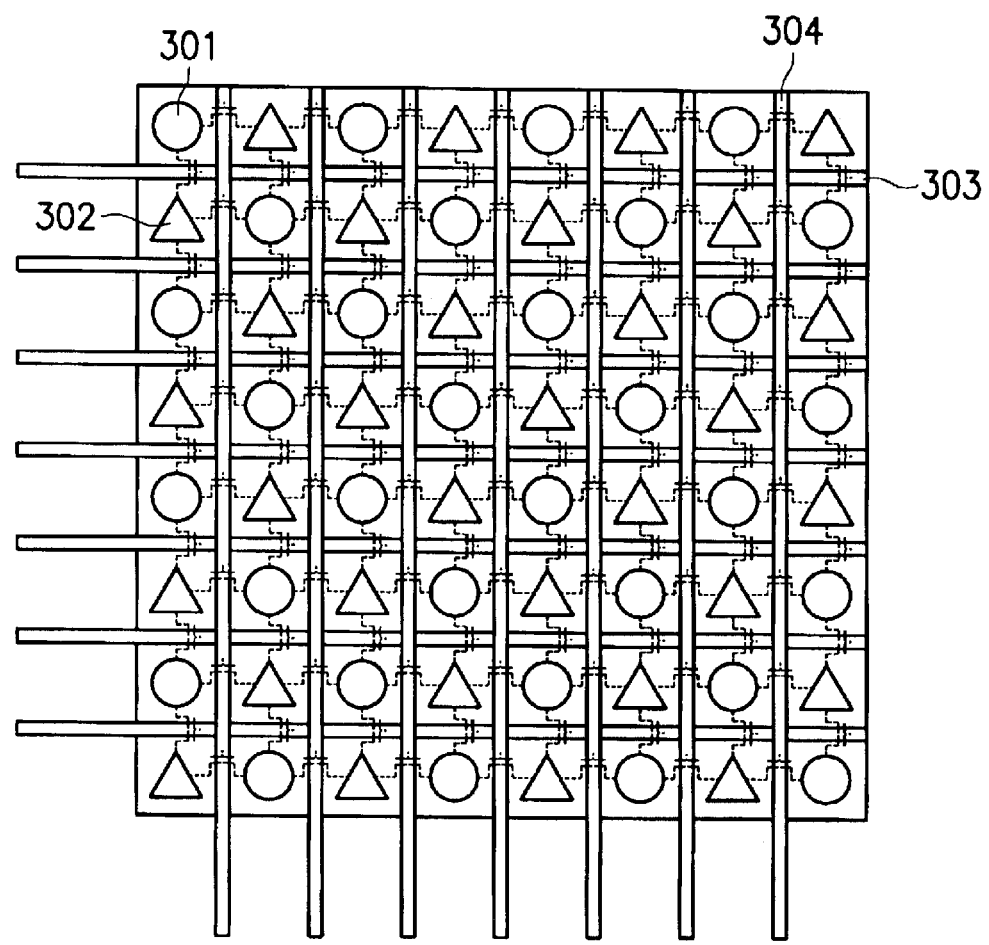
FIG. 3a depicts an 8×8 memory unit array of the present invention.

In FIG. 3a, depicts, an 8×8 memory unit array formed on a semiconductor substrate. The memory unit array comprises a plurality of sources 301, a plurality of drains 302, and a plurality of word lines 303 and 304.

The word lines 303 and 304 are parallel or perpendicular to each other and arranged in a grid. The sources 301 and the drains 302 are arranged on the grids formed by the word lines 303 and 304. The sources 301 and the drains 302 are alternated with each other.

Figure 3B:
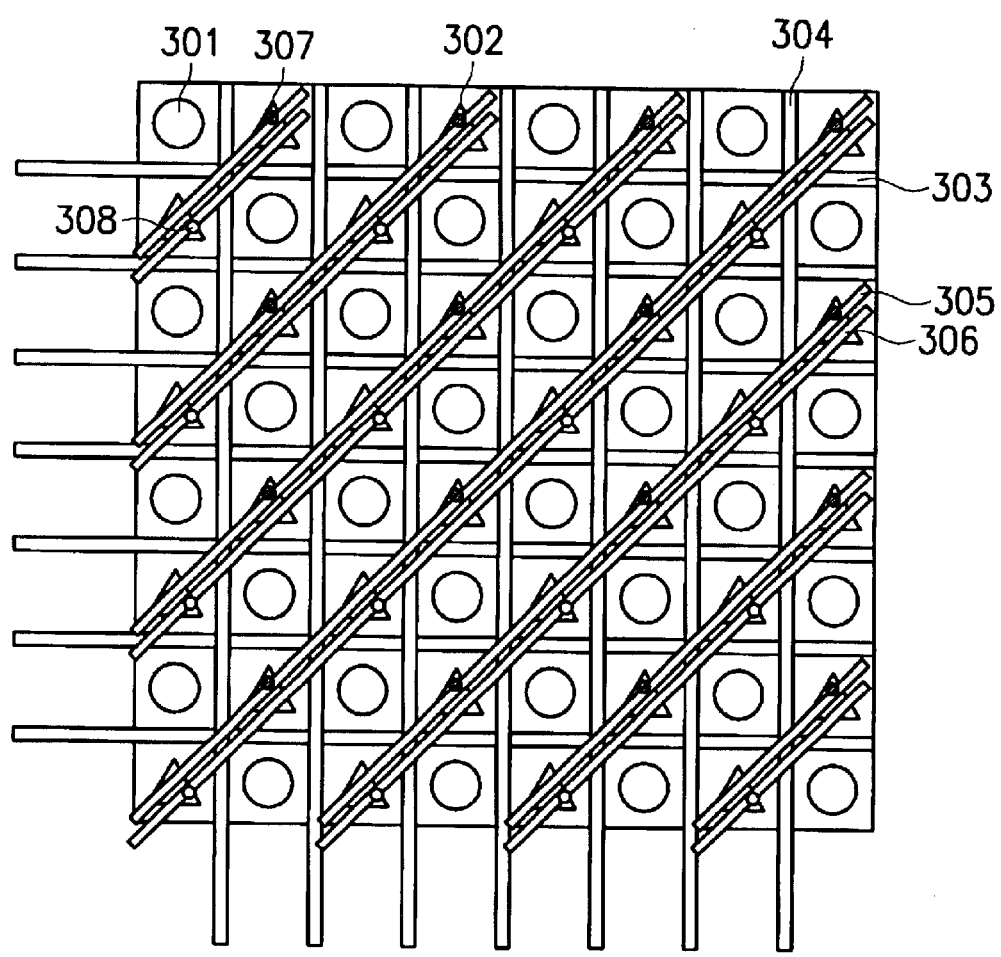
FIG. 3b depicts the first bit lines and the second bit lines of the 8×8 memory unit array of the present invention.

In FIG. 3b, a plurality of first bit lines 305 are arranged in parallel and extending in a direction diagonal to the word lines and above a plurality of drains 302. A plurality of first nodes 307 are arranged on the first bit lines 305, so as to the drains 302 are coupled to the first bit lines 305. The drains 302 are not connected to the first bit lines 305 if the first nodes 307 are not displaced on the first bit lines 305 which above the drains 302, and the drains 302 are connected to the first bit lines 305 if the first nodes 307 are alternately arranged on the first bit lines 305 which above the drains 302, therefore the drains 302 are alternately conducted to the bit lines 305 through the first nodes 307.

In the same way, a plurality of second bit lines 306 are arranged in parallel and extending in a direction diagonal to the word lines and the first bit lines 305 and above the plurality of drains 302. A plurality of second nodes 308 are arranged on the second bit lines 306, so as to conduct the drains 302 and the second bit lines 306. The drains 302 are not connected to the second bit lines 306 if the second nodes 308 are not replaced on the second bit lines 306 which above the drains 302. The second nodes 307 are alternately arranged on the second bit lines 305 which above the drains 302, therefore the drains 302 are alternately conducted to the second bit lines 306 through the second nodes 308.

Therefore, each memory unit is comprised by sources 301, the drains 302, the word lines 303 and 304, and the bit lines 305 and 306.

There is only one node conducted to a bit line above each drain 302. The first nodes 307 and the second nodes 308 are not arranged on the first bit lines 305 and the second bit lines 306 above each drain 302 simultaneously. That is to say, if a first node 307 is arranged on a first bit line 305 above a specific drain 302, then a second node 308 is not arranged on a second bit line 306 above the specific drain 302; while if a second node 308 is arranged on a second bit line 306 above another specific drain 302, then a first node 307 is not arranged on a first bit line 305 above the specific drain 302.

The above-mentioned connective way, alternately couples to the drains 302, so adjacent memory units are not conducted at the same time, so as to avoid shorting adjacent memory units.

Figure 3C:
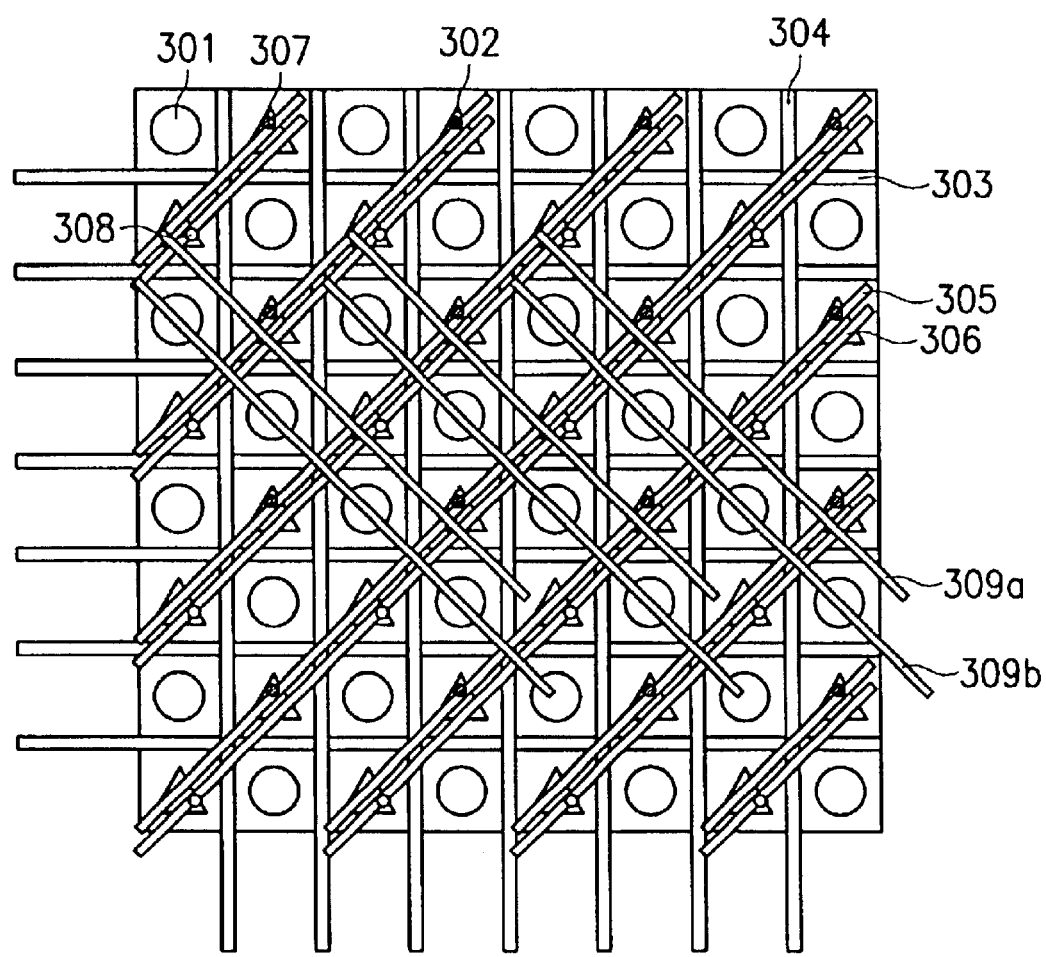
FIG. 3c depicts the third bit lines and the forth bit lines joined with the first bit lines and the second bit lines respectively.

In FIG. 3c, the first bit lines 305 are joined with a plurality of third bit lines 309a, thus the number of the memory units of each first bit line 305 is the same. The third bit lines 309a can be metal wire.

The second bit lines 306 are joined with a plurality of bit lines 309b, thus the number of the memory units of each second bit line 306 are the same. The third bit lines 309b can be metal wire.

The third bit lines 309a and the fourth bit lines 309b are joined to the first bit lines 305 and the second bit lines 306 respectively. Thus the number of the memory units controlled by every first bit line 305 joined to the third bit lines 309a are the same; and the number of the memory units of every second bit line 306 controlled joined with the fourth bit lines 309b are the same, too. As a result the loading is identical in the decoder that is connected to each bit line of the memory units of the present invention. In addition, the method to manufacture the decoder is convenient.

In the prior art, each drain and adjacent two sources consist of two memory units or each source and adjacent two drains consist of two memory units of a Mask ROM. In contrast, in the present invention, the sources and the drains for memory cells are alternatively arranged so that four memory cells can use the same source/drain. The word lines 303 and 304 are parallel or perpendicular to each other, so each drain 302 and adjacent four sources 301 of the present invention consist of four memory units; or each source 301 and adjacent four drains 302 consist of four memory units.

Compared with the conventional Mask ROM, the density of the Mask ROM of the present invention is increased, and the volume of data storage in every chip is raised, thus reducing cost.

While the present invention is described by preferred embodiments, it should be understood that the invention is not limited to these embodiments in any way. On the contrary, it is intended to cover all the modifications and arrangements as they would be apparent to those skilled in the art. Therefore, the scope of the appended claims should be interpreted in the broadest sense so as to encompass all the modifications and arrangements.

What is claimed is:

1. A mask ROM, comprising:
   a plurality of word lines, wherein the word lines are arranged in a grid;

a plurality of memory units arranged between the word lines, each memory unit having a corresponding drain;

a plurality of first bit lines arranged in parallel and extending in a direction diagonal to the word lines and above the drains;

a plurality of second bit lines, arranged in parallel and extending in a direction diagonal to the word lines, and above the drains;

a plurality of first nodes, alternately arranged on the first bit lines;

a plurality of second nodes, alternately arranged on the second bit lines, wherein the second nodes and the first nodes are arranged alternately;

a plurality of third bit lines joined to the first bit lines; and a plurality of fourth bit lines joined to the second bit lines.

2. The mask ROM as claim 1, wherein the first bit lines are perpendicular to the third bit lines.

3. The mask ROM as claim 1, wherein the second bit lines are perpendicular to the fourth bit lines.

4. A mask ROM, comprising:

a memory unit array, wherein the memory unit array comprises a plurality of word lines and a plurality of memory units, the word lines are arranged in a grid, and each memory unit is provided with a corresponding drain;

a plurality of first bit lines, wherein the first bit lines are arranged in parallel and extended in a direction diagonal to the word lines and above the drains, and the drains are coupled or noncoupled with the first bit lines corresponding to the drain on the both sides of each word line;

a plurality of second bit lines, wherein the second bit lines are arranged in parallel and extended in a direction diagonal to the word lines and above the drains, and the drains are coupled or noncoupled with the second bit lines corresponding to the drain on the both sides of each word line;

a plurality of third bit lines, wherein the third bit lines are joined to the first bit lines; and a plurality of fourth bit lines, wherein the fourth bit lines are joined to the second bit lines.

5. The mask ROM as claim 4, wherein the amounts of the memory units at each bit lines are the same.

6. The mask ROM as claim 4, wherein the first bit lines are perpendicular to the third bit lines.

7. The mask ROM as claim 4, wherein the second bit lines are perpendicular to the fourth bit lines.

* * * * *